United States Patent
Haeusermann et al.

(10) Patent No.: US 6,924,650 B2
(45) Date of Patent: Aug. 2, 2005

(54) DEVICE FOR GENERATOR DIAGNOSIS WITH BUILT-IN ROTOR

(75) Inventors: Peter Haeusermann, Dottikon (CH); Ingo Kirchhoff, Zurich (CH); Bernhard Mark, Waldshut-Tiengen (DE); Peter Stutz, Anglikon (CH)

(73) Assignee: Alstom Technology Ltd., Baden (CH)

( * ) Notice: Subject to any disclaimer, the term of this patent is extended or adjusted under 35 U.S.C. 154(b) by 338 days.

(21) Appl. No.: 10/055,957

(22) Filed: Jan. 28, 2002

(65) Prior Publication Data

US 2002/0135383 A1 Sep. 26, 2002

(30) Foreign Application Priority Data

Feb. 14, 2001 (DE) .......................................... 101 07 401

(51) Int. Cl.[7] .............................................. G01R 31/12
(52) U.S. Cl. ........................ 324/546; 324/551; 324/557
(58) Field of Search ............................. 324/158.1, 545, 324/772, 687, 686; 73/12.09

(56) References Cited

U.S. PATENT DOCUMENTS

| | | | | |
|---|---|---|---|---|
| 2,890,407 A | * | 6/1959 | Huehn et al. ................ | 324/545 |
| 4,889,000 A | * | 12/1989 | Jaafar et al. ................ | 73/865.8 |
| 4,901,572 A | | 2/1990 | Suyama | |
| 5,252,927 A | * | 10/1993 | Bruhlmeier et al. ........ | 324/546 |
| 5,557,216 A | * | 9/1996 | Dailey et al. ................ | 324/772 |
| 5,969,531 A | * | 10/1999 | Murakami et al. .......... | 324/545 |
| 6,014,598 A | | 1/2000 | Duyar et al. | |
| 6,100,711 A | | 8/2000 | Hatley | |

FOREIGN PATENT DOCUMENTS

| | | |
|---|---|---|
| DE | 36 34 421 A1 | 4/1988 |
| DE | 43 13 455 A1 | 10/1994 |
| DE | 199 61 628 C1 | 12/1999 |
| EP | 0 647 312 B1 | 4/1995 |
| EP | 0 684 483 A2 | 11/1995 |
| JP | 3-261351 | 11/1991 |

\* cited by examiner

*Primary Examiner*—Nestor Ramirez
*Assistant Examiner*—Jimmy Nguyen
(74) *Attorney, Agent, or Firm*—Burns, Doane, Swecker & Mathis, LLP

(57) ABSTRACT

In a device for the investigation of components of a generator which border on a machine air gap (29) between stator and rotor (22), with the rotor (22) built in, by means of at least one moveable inspection probe (35), a simple, flexible and rapid mounting is ensured in that the device comprises a base unit (31) which can be secured to the rotor (22) on both sides, and which permits at least one inspection probe (35) to move in the machine air gap (29), both in an axial direction with respect to the generator axis and also in the circumferential direction of the machine air gap (29) over the whole circumference of the rotor.

12 Claims, 5 Drawing Sheets

DEVICE FOR GENERATOR DIAGNOSIS WITH BUILT-IN ROTOR

FIELD OF THE INVENTION

The present invention relates to a device for generator diagnosis with built-in rotor, which is capable of transmitting information concerning components bordering on a machine air gap between stator and rotor. The invention furthermore relates to a process for the diagnosis of a generator, particularly for diagnosis relating to the components of the generator bordering on the machine air gap between stator and rotor.

BACKGROUND INFORMATION

The specific monitoring of the overall state of a generator plays a large part in dealing with generators. In order to prevent idle time due to defective components, or to have a basis available for decisions about the replacement or partial replacement of generators, generators therefore have to be periodically investigated in many aspects. Downtime due to such stocktaking is to be as short as possible; that is, the inspections are to be easily possible without great dismantling work and without lengthy investigations and expense of data collection.

In particular, the investigation of the so-called machine air gap, the interspace between the stationary stator and the rotor which rotates during operation, is important here, and should be possible, preferably without expensive removal of the rotor from the stator.

Investigation of the machine air gap involves, on the one hand, obtaining information by visual methods concerning short-circuited coils in the rotor winding, the ends of the laminations, the state of the portions visible in the stator bore, such as, e.g., keys and laminations, rotor surface including keying and caps, etc.

On the other hand, other measuring processes are carried out to determine the state of the components bordering on the air gap, centered on the following: stator keying, stator lamination bundle, and lamination short circuits. The method of evaluation of the state of the stator keying is based, for example, on a system which hammer tests the wedges with a fixed force and registers the resulting vibrations. The state of the stator lamination bundle is determined by a method based on the measurement of the groove leakage flux, which varies in the presence of short circuits. The groove leakage flux is produced by ring magnetization (low induction) of the lamination bundle. Possible short circuits are thus localized by recording the leakage flux picture of the lamination edges.

According to the prior art, the investigation of the machine air gap with the rotor built in mostly takes place in that devices are attached to the fan seated on the rotor, to the stator housing, or to the stator, and make possible the introduction of inspection probes into the gap in a controlled manner. Because of different geometry of fans, stators and stator housings in different generators, large adjustments of the device to the circumstances in the generator are frequently carried out when such devices are built in.

SUMMARY OF THE INVENTION

The invention accordingly has as its object to make available a device for the investigation of components of a generator which border on a machine air gap between stator and rotor, with the rotor built in, by means of at least one movable inspection probe, which device can be easily and rapidly installed in generators of different construction and dimensions, and in which the inspection probe can be moved in the whole machine air gap, in order to be able to investigate all regions.

This object is attained in that the proposed device includes a base unit which can be fastened to the rotor on both sides, and which permits movement of at least one inspection probe in the machine air gap both axially in relation to the generator axis, and also in the circumferential direction of the machine air gap over the full extent of the rotor.

The essence of the invention thus consists in not fastening the device to the stator or to the stator housing, but at least indirectly to the rotor. Because of the substantially like construction of the rotors in different types of generator, the advantage directly results that hardly any adjustments are necessary for use of such a device on different generators, and that consequently the device can be installed quickly and easily. In particular, the proposed solution can be advantageously used for generators with particularly narrow space conditions in the region of the end turns, and for small generators. When such a generator is built into a single shaft plant, in which the generator is "clamped in" between a steam turbine and a gas turbine, and in which dismantling the generator is made difficult, the utility of inspection services with the rotor built in particularly increases.

A preferred embodiment of the invention is characterized in that the base unit can be fastened to the rotor caps installed on the ends of the rotor. In particular, the rotor caps, which mostly have a simple, smooth cylindrical shape, are substantially all equal as regards dimensions for all generators, and therefore are particularly suitable for the fastening of the device. In particular, when the base unit of the device includes two end portions, which are fastened to the rotor caps, a particularly simple, flexible construction results when at least one, but preferably two, carrying cables are arranged between the end portions, and the at least one inspection probe is mounted on them, to be axially displaceable in the machine air gap. The carrying cables then assume a double function: on one hand, they serve to guide the inspection probe, and on the other hand, they also brace the two end portions of the base unit against each other in the gap and thus effect the axial fixing of the base unit on the rotor. The constitution of this axial fixation by carrying cables furthermore has the advantage that the device can easily be adjusted to different generator lengths by adjusting the length of the carrying cables.

According to a further embodiment, the at least one inspection probe is fastened to a tension cable, the said tension cable being fastened so that it can be rolled up by means of tension rollers installed on the end portions, such that the inspection probe can be displaced in the axial direction by synchronous rotation of the two tension rollers. Furthermore preferably, the tension cable is rolled up on both sides onto the tension rollers so that the use of the device is possible with different generator lengths. The use of a tension cable furthermore permits, on one hand the simple implementation of the displacement of the inspection probe, and on the other hand the device can thus also be adjusted for different generator lengths without troublesome threading of the tension cable around the rollers. This is because the tension cable is not constituted to circulate, but is rolled up on each of the tension rollers.

A further preferred embodiment is characterized in that the base unit is movably mounted to revolve on the rotor cap. In particular, this is effected by arranging the end portions on the radially outside cylindrical surface of the rotor cap and fastening them to the rotor caps with belts which pass around this outside cylinder surface. An adjustment to a different rotor diameter can be effected in a particularly simple manner when the belts consist of individual pieces, and same elements are used particularly at the connection points between the individual pieces and facilitate the displaceability of the base unit on the rotor cap in a direction circulating around the circumferential direction of the machine air gap. These elements can for example consist of rollers which roll on the rotor cap circumference and which prevent the belts from producing, on the circumference, too much friction opposing the rotation of the base unit. The movement of the unit on the rotor cap can be effected by movement rollers which roll on the rotor cap and are driven by motors arranged in the end portions.

A further preferred embodiment is characterized in that the movement rollers are of conical form and are arranged on the end portions in a manner such that the end portions always have the tendency, when moving on the rotor cap, to move toward the interior of the machine air gap, and that furthermore the end portions have a stop which comes to abut on the axially outer end of the rotor cap, so that the inward-directed movement due to the conical movement rollers is limited. The device can be simply and efficiently prevented in this manner from going out of adjustment on circumferential rotation of the device on the rotor cap.

The invention furthermore relates to a process for the investigation of generator components bordering on a machine air gap between stator and rotor when the rotor is built in, by means of at least one movable inspection probe, using a device as described hereinabove.

BRIEF DESCRIPTION OF THE DRAWINGS

The objects and advantages of the present invention will be further understood by reading the following detailed description in conjunction with the drawings, wherein.

DETAILED DESCRIPTION OF THE INVENTION

Figure 1:
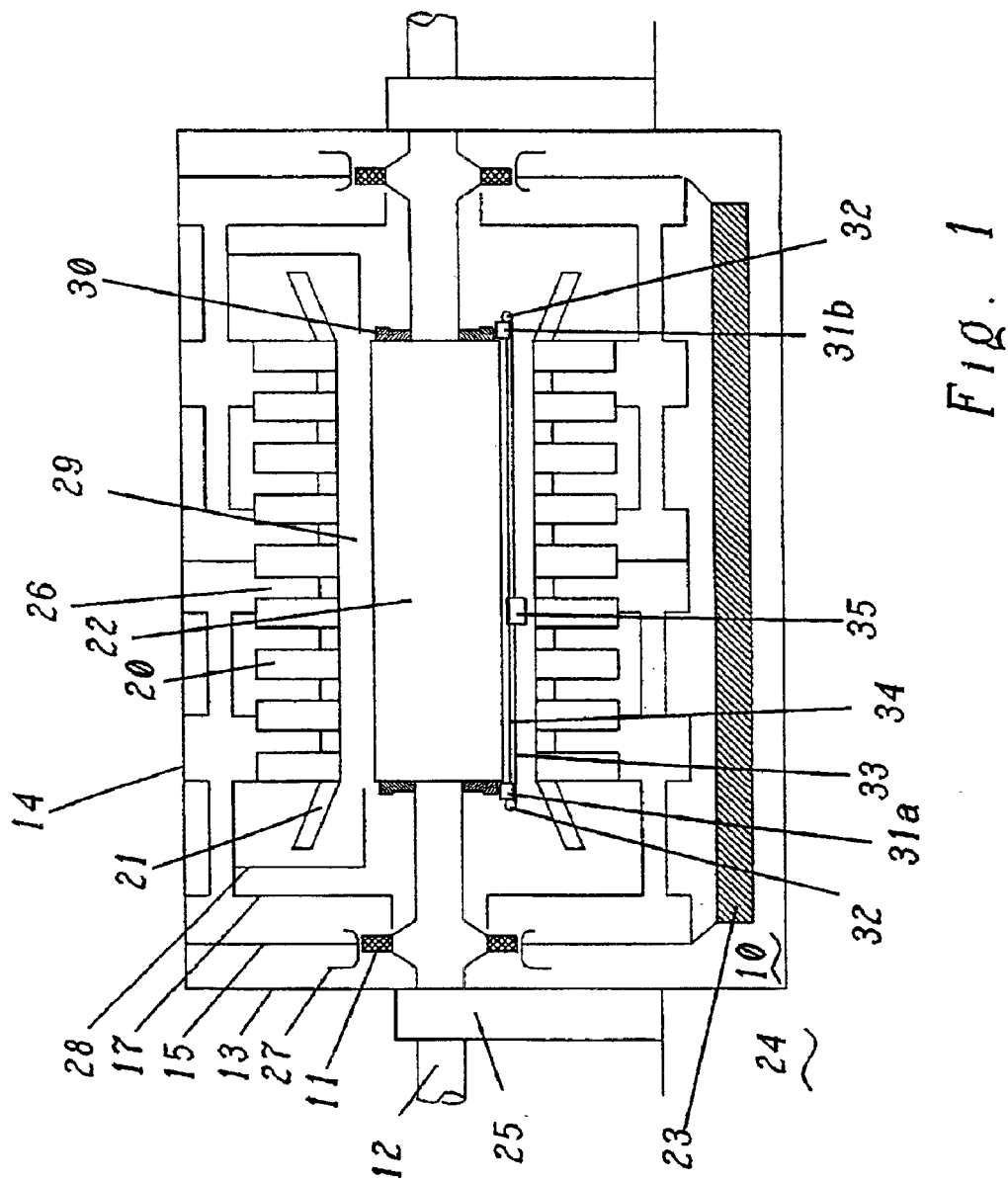
FIG. 1 shows a schematic section through a generator with a built-in diagnostic device.

FIG. 1 shows a schematic longitudinal section through a generator. The generator shows as an example operates on the suction cooling principle, but the use of the proposed device is in no way limited to such generators. The generator is bounded on the ends and back by machine housing covers 13, and is longitudinally enclosed by a cylindrical machine housing 14. The housing includes a stator lamination member formed by partial lamination members 20, and in which radial ventilation slots 26 are present between the different partial lamination members 20. A rotor 22 is situated in the center of the stator lamination member, and the associated rotor shaft 12 is mounted in pedestal bearings 25 which are supported on the foundation 24.

The foundation 24 has a foundation ditch 10 which extends axially over the whole length of the machine housing 24 and in which a cooling arrangement 23 of the generator is arranged. The inlet openings of the cooling arrangement 23 are connected to outflow spaces of main fans 11 arranged on both sides of the rotor 22. The main fan 11 is secured to the rotor shaft 12 and rotates at the same speed as the rotor 22. Baffles 28, internal casings 17, plate diffusers 27, and outer casings 15 are arranged for specific guiding of the cooling air streams through the end turns 21 of the stator into the machine air gap 29 between the rotor and stator, and also into the rotor 22.

In the upper half of FIG. 1, the unmodified generator is shown, while in the lower half it is indicated that certain components, such as the baffle plate 28 here, have to be removed. Normally, before mounting the device, the generators have to be flushed in the case of water-cooled models, and diffusers, lamination casings and air gap diaphragms have to be removed or displaced, and the upper portions of end shields likewise have to be removed if necessary, in order to permit access to the rotor. A section is now shown through a diagnostic device mounted in the machine air gap in the six o'clock position. The device consists of a base unit 31 with two end portions 31a and 31b, which are secured to the rotor caps 30. At first at least one carrying cable 34 runs between the end portions, and on the one hand serves to brace the two end portions against each other in the axial direction and thus to fix the device on the rotor. On the other hand, the carrying cables also serve for the displaceable guiding of the inspection probe 35 in the axial direction. The end portions 31a and 31b furthermore each have a tension roller 32, on which a tension cable 33 is wound. The inspection probe 35 is secured to the tension cable 33, and the probe is displaced in the axial direction in the machine air gap 29 by synchronous opposed rotation of the tension rollers 32a and 32b.

Figure 2:
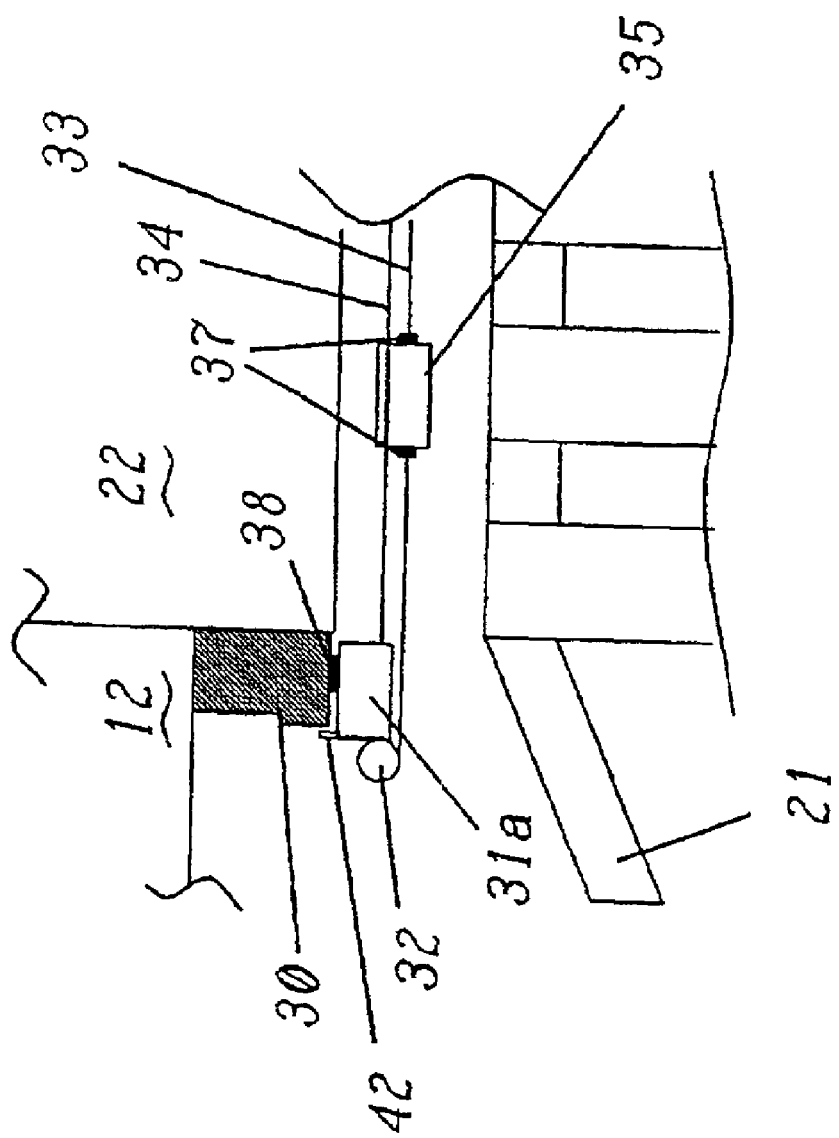
FIG. 2 shows a detailed section through the end region, with the diagnostic device in place.

FIG. 2 now shows a detail view of a section through the mounted end portion 31a. The end portion abuts with movement rollers 38 on the cylindrical outer surface of the rotor cap 30. The movement rollers 38 are driven by motors arranged in the end portion and permit the movement of the whole device in the circumferential direction of the machine air gap in a direction circulating around the rotor cap. By the guiding of the probe on the carrying cables in combination with the rotation around the rotor cap, it is thus ensured that the probe can be guided to any location in the machine air gap, and thus the investigation of the whole surface of both the stator and also the rotor surface is made possible.

So that the end portions 31a and 31b, braced together by means of the carrying cable 34, do not go out of adjustment on rotation around the rotor cap 30, the movement rollers are preferably cut conically such that the respective end portion has the tendency, when it rotates, to displace toward the interior of the gap 29, i.e., to move the end portions toward one another. This is effected in that the movement roller diameter axially remote from the rotor is kept slightly larger than that facing toward the rotor. The movement of the end portions in the direction of the interior of the machine air gap is limited by a stop 42, which can likewise if necessary be provided with a small guide roller, in that the stop 42 abuts on the end face of the rotor cap which is axially remote from the rotor 22. Thus the end portions 31a and 31b are fixed relative to one another in a well-defined and self-stabilizing manner. In order to prevent wedging of the device when there is an unequal angular position of the two end portions 31a and 31b, as described in FIG. 5, the carrying cables are preferably secured in a resilient manner to the end portions.

Figure 3:
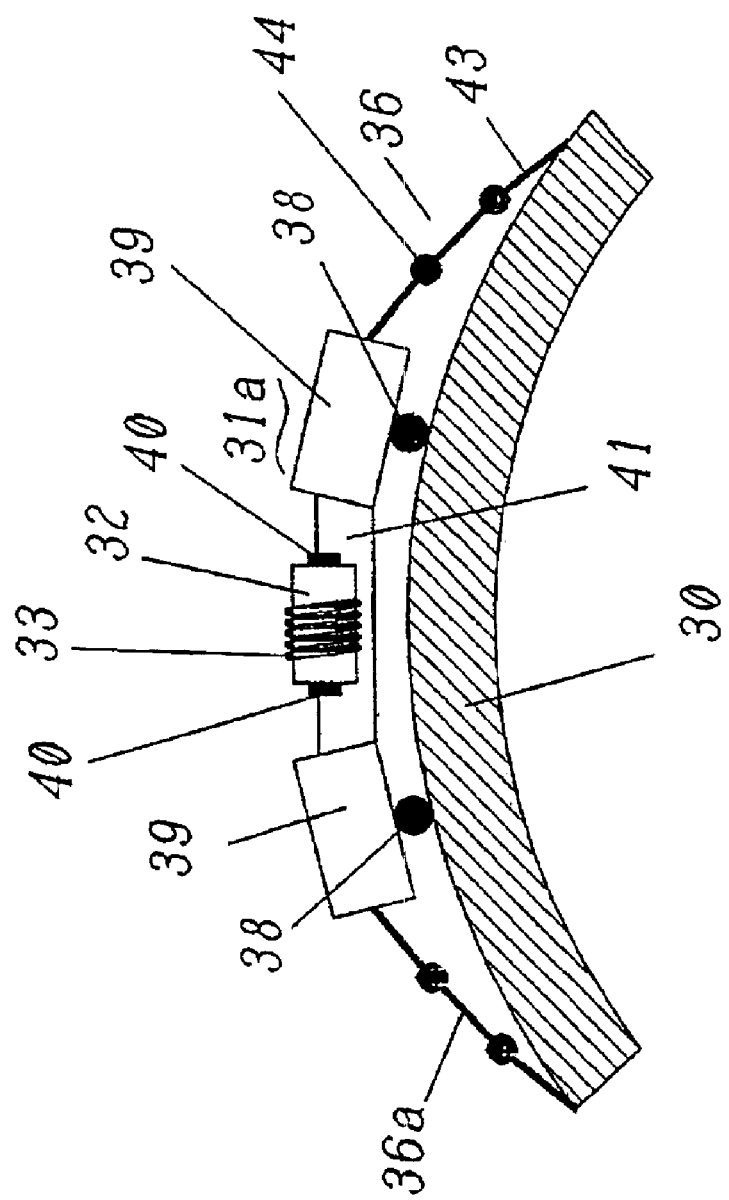
FIG. 3 shows a view of the diagnostic device in the axial direction from the end of the rotor.

FIG. 3 shows a view of an end of a rotor with a mounted device. The end portion 31a is fixed to the rotor cap 30 by means of a belt 36 around the rotor cap 30, as is also the (not visible) end portion 31b. An end portion then has two lateral motor housings 39 in which the motors for the movement rollers 38 are arranged, and on which the movement rollers 38 are also themselves likewise mounted. Between the motor housings is situated a middle portion 41 which connects these and to which the tension roller 32 is attached by means of mountings 40. The tension cable 33 is wound up on the tension roller and serves for the displacement of the inspection probe. The tension roller 32 is driven in a controlled manner by a motor, which is not shown here. The tension cable 33 is then constituted, not circulating but as a cable rolled up on both sides, so that the inspection of generators of different lengths is possible.

Figure 4:
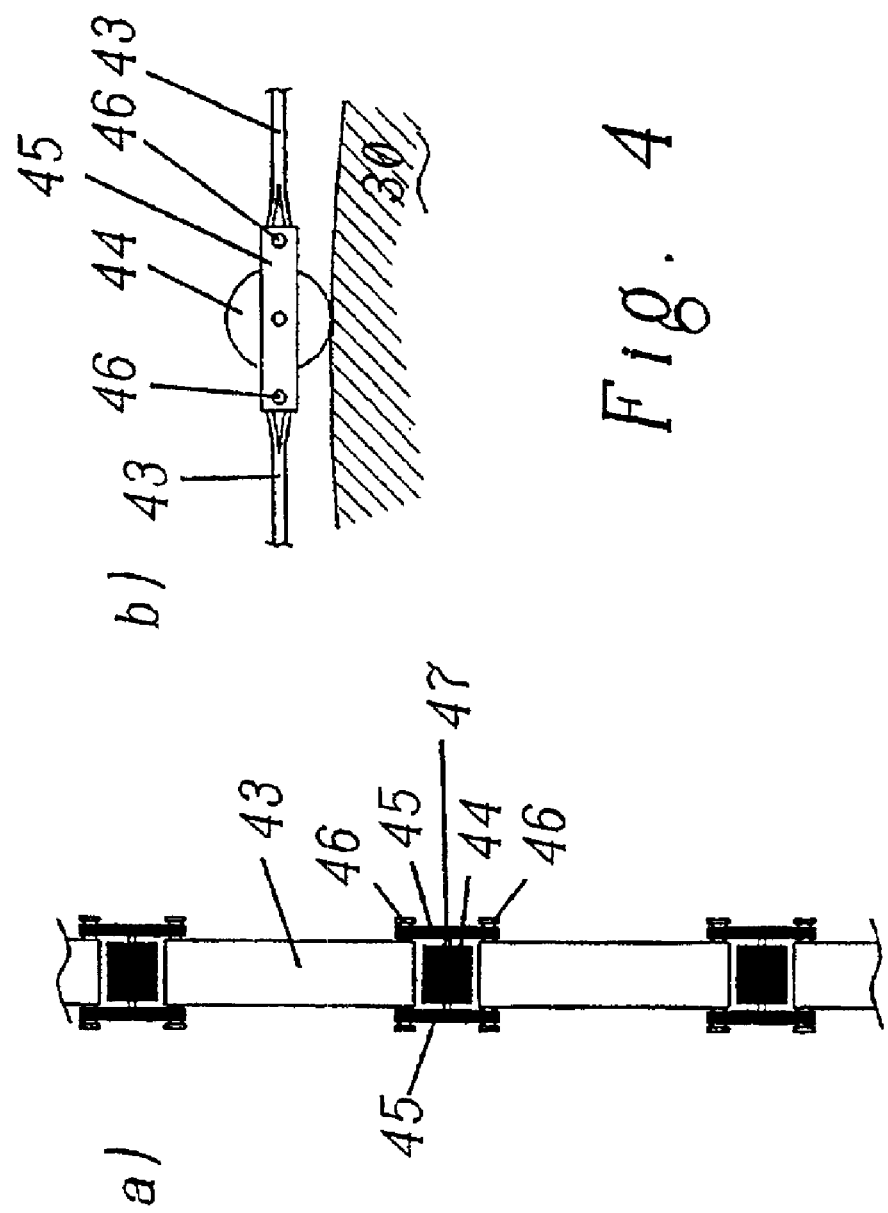
FIG. 4A shows the belt pieces and rollers in a plan view.
FIG. 4B shows the belt pieces and rollers in a side view.

In order to ensure that the end portions around the rotor periphery can rotate without much friction on the rotor cap, the belts 36 are to be specially formed. FIGS. 4A, 4B show such belts. On one hand, the belts 36 consist of individual pieces 43, which permits easy adaptability to different rotor cap diameters. On the other hand, the individual pieces 43 are connected by special connecting pieces, which ensure that the belts 36 do not abut on the rotor cap 30 at all, but only the elements 44 constituted as rotatable belt rollers. The belt rollers 44 are then held by side members 45 which in their turn hold the individual belt pieces 43 on both sides by means of pins 46. Care has to be taken here that the length of the belt pieces 43 and the diameter of the belt rollers 44 is matched such that for all rotor diameters to be investigated it is ensured that the belt does not abut on the rotor cap surface, i.e., the belt rollers 44 by their diameter sufficiently space the belt pieces 43 from the cylindrical surface of the rotor cap. FIG. 4A also shows a shaft 47 of the belt roller 44.

Figure 5:
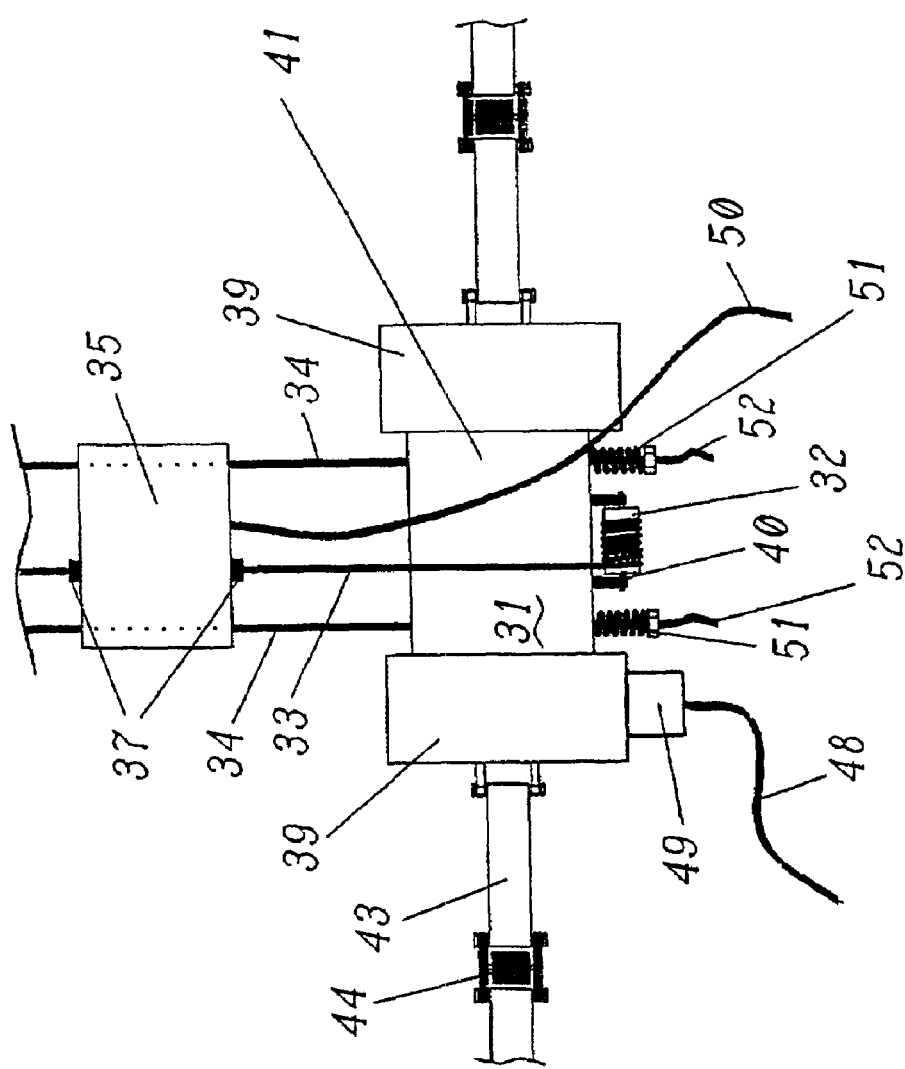
FIG. 5 shows a plan view of the mounted diagnostic device.

FIG. 5 shows a view of a mounted device, in a radial direction from outside toward the rotor. The inspection probe 35 is laterally guided displaceably by two carrying cables 34. The tension cable 33, on the other hand, is secured by fastening points 37 to the probe 35, permitting the axial displacement of the probe 35 by means of the tension rollers 32, with the two rollers synchronously working the two end portions 31a and 31b. Diverse inspection units can now be fixed to the inspection probe 35, according to the subject to be investigated. Each unit advantageously has a camera which can be used for positioning and orientation of the probe, and which also makes accessible visual information concerning short-circuited coils in the rotor winding, the ends of the lamination bundle, and the state of the portions visible in the stator bore such as, e.g., wedges and laminations, rotor surface including keying and caps, etc. On the other hand, each unit has an equipment for a respective measurement method for data determination with respect to stator groove keying, stator lamination bundle, lamination short circuits, etc. Thus for example for the evaluation of the state of the stator wedging of a system which hammer tests the wedges with a specified force and records the resulting vibrations, or else a system for the determination of the state of the stator lamination bundle based on the measurement of the groove leakage flux, which changes in the presence of short circuits. The groove leakage flux is then produced by ring magnetization (low induction) of the lamination bundle, and possible short circuits are localized by recording the leakage flux picture of the lamination teeth.

The inspection probe is connected to a data cable 50 by means of which the information transmitted from the inspection units is transmitted to a data processing apparatus outside the generator.

As already explained hereinabove, the carrying cables 34 are preferably resiliently mounted on the end portions, so that the apparatus cannot become wedged. For this purpose, return springs 51 are provided, ideally so that the carrying cables 34 can be of optional length, and an excess 52 of the cable 34 can project out, and the spring mechanism can be respectively adjusted for a given rotor length.

Each end portion 31 furthermore has an electronic unit 49 which is connected via a control cable 48 to the same data processing equipment as mentioned above, i.e., a data processing equipment controls the two end portions and simultaneously senses the data from the inspection unit. The electronic unit 49 serves to control the movement rollers 38 and to control the tension roller 32, and also, if necessary, for further controls on the respective end portion.

The presently disclosed embodiments are therefore considered in all respects to be illustrative and not restrictive. The scope of the invention is indicated by the appended claims rather than the foregoing description, and all changes that come within the meaning and range and equivalence thereof are intended to be embraced therein.

What is claimed is:

1. A device for the investigation of components of a generator which border on a machine air gap between a stator and a built in rotor of the generator, by means of at least one movable inspection probe, the device comprising:

a base unit which is securable to the rotor on both sides, and which permits the at least one inspection probe to move in the machine air gap, both in an axial direction with respect to the generator axis and also in the circumferential direction of the machine air gap over the whole circumference of the rotor, wherein the base unit is secured to rotor caps installed at the ends of the rotor.

2. The device of claim 1, wherein the base unit comprises two end portions which are secured to the rotor caps, and wherein at least one carrying cable is arranged between the two end portions and the at least one inspection probe is displaceably mountable in the axial direction in the machine air gap, on the at least one carrying cable.

3. The device of claim 2, wherein the at least one inspection probe is secured to a tension cable, which tension cable is secured to be able to roll on tension rollers installed on the end portions such that the inspection probe is displaceable in the axial direction by means of synchronous rotation of the two tension rollers.

4. The device of claim 3, wherein the tension cable is rolled on the tension rollers on both sides such that the use of the device is possible with different generator lengths.

5. The device of claim 2, wherein the end portions of the base unit are mounted to move circumferentially on the rotor caps.

6. The device of claim 5, wherein the end portions are arranged on outer circumferential surfaces of the rotor caps and are secured to the rotor caps with belts running around the outer circumferential surfaces.

7. The device of claim 6, wherein the belts comprise individual pieces which effect an adaptation to different rotor diameters, and elements between the individual pieces, facilitating the displaceability of the base unit on the rotor cap, circulating in the circumferential direction of the machine air gap.

8. The device of claim 5, wherein the mobility of the base unit on the rotor caps is effected by means of movement rollers which roll on the rotor caps and are driven by motors arranged in the end portions.

9. Device according to claim 8, wherein the movement rollers are of conical shape and are arranged on the end portions such that the end portions always have the tendency, on movement on the rotor caps, to move toward the interior of the machine air gap, and wherein the end portions have a stop which respectively comes to abut against the axially outward end of the rotor caps, whereby the inward directed movement effected due to the conical movement rollers is limited.

10. The device of claim 1, wherein the inspection probe is guided laterally by two carrying cables and comprises a camera for visually inspecting the generator and for positioning the inspection probe.

11. The device of claim 10, wherein the inspection probe comprises means for investigating stator groove keying.

12. The device of claim 10, wherein the inspection probe comprises means for investigating the stator lamination bundle.

* * * * *